United States Patent [19]

Otsuki et al.

[11] Patent Number: 5,530,277
[45] Date of Patent: Jun. 25, 1996

[54] INSULATED-GATE BIPOLAR TRANSISTOR

[75] Inventors: Masahito Otsuki; Shigeyuki Obinata; Yukio Yano, all of Nagano, Japan

[73] Assignee: Fuji Electric Co., Ltd., Kawasaki, Japan

[21] Appl. No.: 321,999

[22] Filed: Oct. 12, 1994

[30] Foreign Application Priority Data

Oct. 14, 1993 [JP] Japan .................................. 5-256197
Feb. 25, 1994 [JP] Japan .................................. 6-027074

[51] Int. Cl.$^6$ ................................. H01L 29/76
[52] U.S. Cl. ................. 257/378; 257/139; 257/173; 257/174; 257/341; 257/355; 257/360
[58] Field of Search ..................... 257/139, 341, 257/378, 173, 174, 355, 360

[56] References Cited

U.S. PATENT DOCUMENTS 4,965,710 10/1990 Pelly et al. .
5,063,307 11/1991 Zommer .

FOREIGN PATENT DOCUMENTS 4209148 10/1992 Germany .
4219019 12/1992 Germany .

Primary Examiner—Edward Wojciechowicz
Attorney, Agent, or Firm—Kanesaka & Takeuchi

[57] ABSTRACT

An insulated-gate bipolar transistor is formed of a number of cells integrally formed on a semiconductor substrate. The cells includes main cells with emitter electrodes, and current detection sensing cells situated adjacent to the main cells. Emitter electrodes are formed in an area of the sensing cells to be separated from the emitter electrodes of the main cells, and an overcurrent protection circuit is connected to the emitter electrodes of the sensing cells. When shorting accident occurs, an overcurrent protecting operation is performed such that an overcurrent is accurately detected through the sensing cells and a main current flowing through the main cells is made smaller than a short-circuit withstanding capacity of the IGBT by gate control of the protection circuit.

5 Claims, 4 Drawing Sheets

INSULATED-GATE BIPOLAR TRANSISTOR

BACKGROUND OF THE INVENTION AND RELATED ART STATEMENT

The present invention relates to an insulated-gate bipolar transistor (IGBT) as a power switching device applied to an inverter apparatus and so on.

An insulated-gate bipolar transistor (hereinafter referred to as IGBT) is a voltage-driven semiconductor switching device capable of high-speed on/off turning with a relatively low on-voltage, and is widely used in the field of power electronics including an inverter apparatus.

In the IGBT-output type inverter apparatus, an overcurrent flows through the IGBT at a starting-up of a motor or at an accident, such as load short-circuit or arm short-circuit. Therefore, strict requirements for withstanding high voltage and large current are imposed on the IGBT. Among the required items of the electrical characteristics, there is a breakdown withstanding capability called as a short-circuit withstanding capability.

On the other hand, the inverter apparatus includes a protection circuit that detects a short-circuit accident and shuts down the power. However, it takes about 10 to 20 micro seconds until the protection circuit starts to function from the overcurrent detection, so that the IGBT is required not to break during that period.

In view of the above, recent high-performance IGBT modules include an overcurrent protection system separately from the protection circuit of the above-described protection circuit. According to this overcurrent protection system, an overcurrent flowing through the IGBT at a short-circuit accident is quickly detected, and a signal based on the overcurrent detection is applied to the gate which controls the current flowing through the IGBT to be self-limited under or less than the short-circuit withstanding capability or capacity of the device before the power is shut down by the above protection circuit.

FIG. 7 shows an overcurrent protection circuit for an IGBT according to the above overcurrent protection system. In FIG. 7, reference numeral 1 denotes a main element (IGBT). A current detection auxiliary element 2, which is an IGBT different from the main element 1, is connected parallel to the main element 1. A current detection resistor 3 is connected in series to the auxiliary element 2. A switching element (MOSFET) 4, which turns on and off in accordance with a voltage appearing across the current detection resistor 3, is connected to gate drive circuits for both the main element 1 and the auxiliary element 2.

In the above structure, when an overcurrent flows through the main element 1 and the auxiliary element 2 due to an accident, such as a load short-circuit, and, as a result, a voltage appearing across the current detection resistor 3 exceeds a threshold voltage of the switching element 4, the switching element 4 is turned on to decrease the gate voltage of the main element 1 and the current detection auxiliary element 2, to thereby lower the main current flowing through the main element 1 that is the subject to be protected. In this case, the main current flowing through the IGBT as the subject to be protected can be made smaller than the short-circuit withstanding capability or capacity of the IGBT by properly setting the resistance of the current detection resistor 3 and the threshold voltage of the switching element 4.

Short-circuit of an inverter includes accidents, such as arm short-circuit, series short-circuit, output short-circuit, grounding short-circuit and so on. In order to perform a reliable protection by quickly detecting an overcurrent flowing though the main IGBT element 1 with high accuracy, it is very important that the ratio of the main current in the main element 1 to the detection current in the auxiliary element 2 is always kept constant irrespective of the above various kinds of short-circuit modes. Further, the collector-emitter voltage $V_{CE}$ applied to the IGBT to be protected is expected to vary with the difference in the short-circuit mode in the load short-circuit accidents of an inverter. Then, the above-described overcurrent protection circuit must limit the overcurrent under the short-circuit withstanding capacity of the IGBT so that the limited current has little dependency on the collector-emitter voltage $V_{CE}$ with little variation.

In the conventional protection circuit in which the current detection auxiliary element 2 is provided separately from the main element 1, it is technically difficult to make operation characteristics of the main element 1 and the auxiliary element 2 proportional to each other. In particular, when the collector-emitter voltage $V_{CE}$ of the IGBT varies as described above, the current ratio between the main element 1 and the auxiliary element 2 varies and, accordingly, the limited current value also varies greatly. Thus, it is difficult to establish a reliable overcurrent protecting operation.

The present invention has been made in view of the above circumstances, and has an object of providing an insulated-gate bipolar transistor with an overcurrent limiting function, which provides reliable overcurrent protection by keeping the ratio between the main current and the detection current constant under various operation environments, and suppressing a collector-emitter voltage dependency and a variation of the limited current.

SUMMARY OF THE INVENTION

To attain the above object, the invention provides an insulated-gate bipolar transistor including a number of cells integrally formed on a semiconductor substrate, wherein parts of the cells are used as current detection sensing cells, and emitter electrodes to be connected to an overcurrent protection circuit are formed in an area of the sensing cells so as to be separated from emitter electrode of main cells.

The sensing cells may be formed at an outermost portion of the semiconductor substrate adjacent to the main cells. At least a part of the sensing cells may be formed to be located in an active region of the main cells.

Further, to suppress the voltage dependency and variation of an overcurrent limited value, it is effective to set a pitch between the cells less than 50 micro meter.

In the above structure, a magnitude of current flowing through the IGBT is detected as a voltage across a current detection resistor of an overcurrent protection circuit (see FIG. 7) connected to the above emitter electrodes of the current detection sensing cells formed on the same semiconductor substrate as the main cells. When an overcurrent flows as a result of an accident, such as a load short-circuit, the main current flowing through the main cells is suppressed under the short-circuit value or withstanding capability to protect the IGBT from breakdown. In this case, since the sensing cells are arranged along with the main cells on the same semiconductor substrate, the carrier distribution in the main cell region is approximated by that in the sensing cell region, so that overcurrent detection can be made in a very short period while the ratio between the main current and the detection current is always kept constant.

In particular, at least a part of the sensing cells is formed to be inserted or located in the active region of the main cells, and the pitch between the cells formed on the substrate, for example, in a striped form, is set not more than 50 micro meter. Accordingly, the current detection accuracy is further improved, and the limited current value can be suppressed under or smaller than the short-circuit withstanding capability of the IGBT with little variation and dependency on the power supply voltage.

DETAILED DESCRIPTION OF PREFERRED EMBODIMENTS

An embodiment of the present invention will be hereinafter described with reference to the accompanying drawings.

Figure 1A:
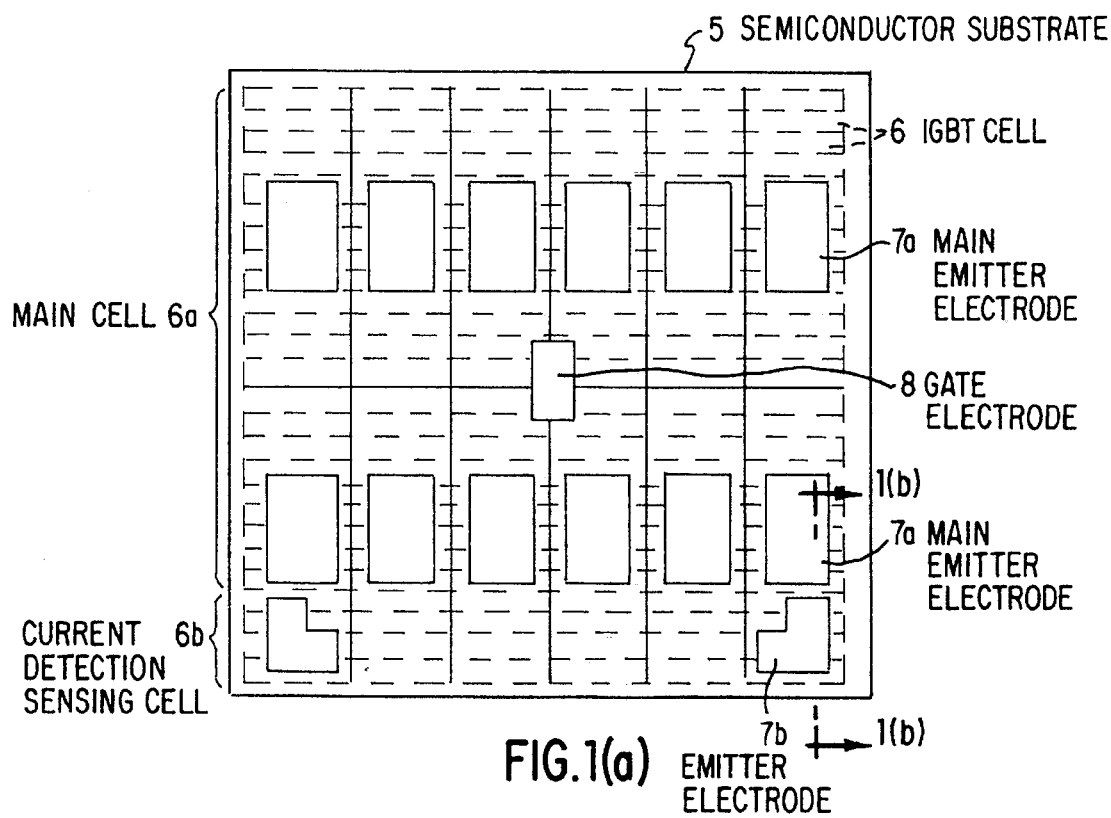
FIG. 1(a) is a plan view of transistor chips of insulated-gate bipolar transistors according to an embodiment of the present invention.
Figure 1B:
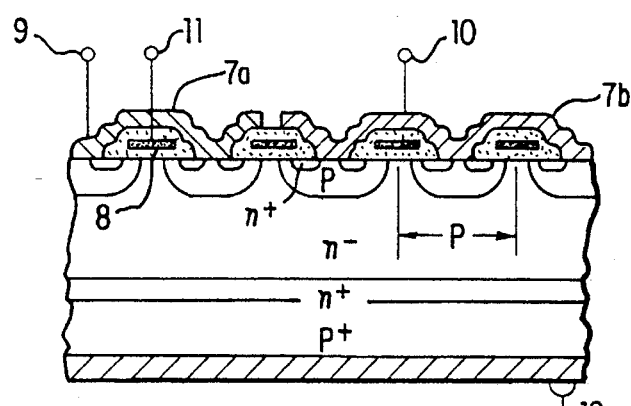
FIG. 1(b) is an explanatory section view generally taken along a line 1(b)–1(b) in FIG. 1(a) for showing an IGBT structure formed in the chip.

FIGS. 1(a) is a plan view of IGBT chips, and FIG. 1(b) is a sectional view of a cell structure formed in the chips. As shown in FIGS. 1(a) and 1(b), a number of IGBT cells 6 is formed on a semiconductor substrate 5 and arranged in a striped form. Most of the IGBT cells are used as main cells 6a, and parts of the IGBT cells located in an outermost area of the semiconductor substrate 5 are used as current detection sensing cells 6b. On the upper surface side of the chips of the semiconductor substrate 5, emitter electrodes 7b of the sensing cells 6b are formed separately from main emitter electrodes 7a of the main cells 6a.

A gate electrode 8 for all the IGBT cells 6 is formed concentrically in a center portion of the chips. In FIG. 1(b), reference numeral 9 denotes a main emitter terminal connected to the main emitter electrode 7a of the main cells 6a. Numeral 10 denotes a current detection emitter terminal connected to the emitter electrode 7b of the sensing cells 6b. Numeral 11 denotes a gate terminal connected to the gate electrode 8, and numeral 12 denotes a collector terminal connected to a collector electrode formed on the back side of the substrate.

Figure 7:
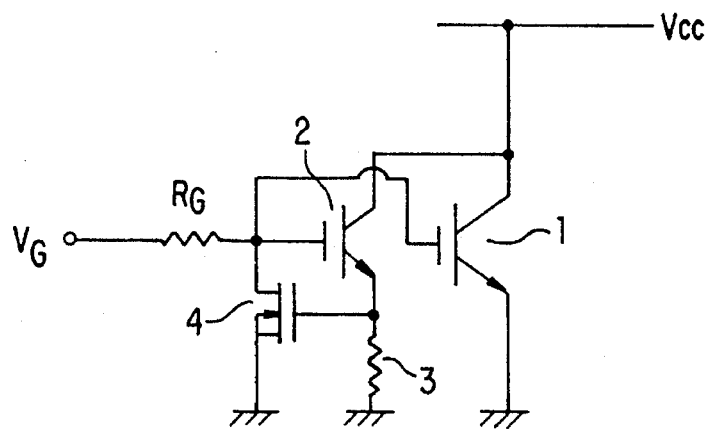
FIG. 7 is a circuit diagram of an overcurrent protection circuit for an IGBT applied to the invention.

The emitter electrode 7b is connected to the current detection resistor 3 shown in FIG. 7 to constitute the overcurrent protection circuit. The resistor 3 and the auxiliary element 4 of the overcurrent protection circuit shown in FIG. 7 can be incorporated into the circuit by forming these elements on the semiconductor substrate 5 around the gate electrode 8, or by forming these elements on a separate chip, which is incorporated in a package of the IGBT module.

The operation of the above overcurrent protection circuit for the IGBT is substantially the same as that already described in connection with FIG. 7, and an overcurrent is detected by the current detection resistor of the overcurrent protection circuit (see FIG. 7) through the emitter electrode 7b of the current detection sensing cells 6b formed on the same semiconductor substrate 5 as the main cells 6a. Since the carrier distribution of the main cells 6a in a peripheral area is approximately the same as that of the sensing cells 6b formed on the same substrate, a limited current value of the main current can be made lower than the short-circuit withstanding capacity of the IGBT in a very short period while continuously keeping the ratio between the main current of the main cells 6a and the detection current constant and accurately detecting an overcurrent.

Figure 3:
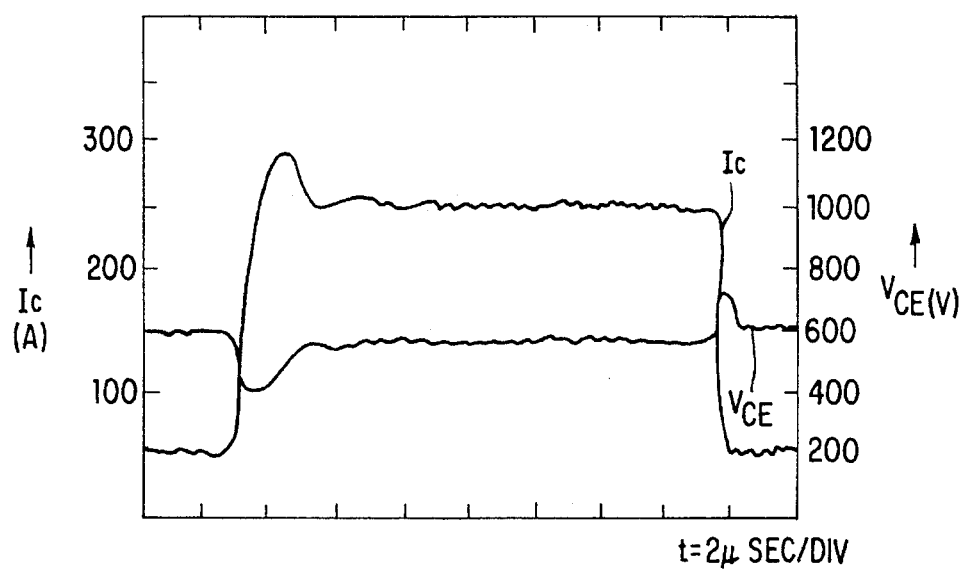
FIG. 3 is an operation waveform diagram when a protection circuit is connected to the structure of FIG. 1 and current limitation is made in a load short-circuit state.

FIG. 3 shows operation waveforms (a collector current $I_C$ of the main cells and a collector-emitter voltage $V_{CE}$) obtained in a short-circuiting test, in which an overcurrent protection circuit was constituted by connecting the current detection resistor 3 and the switching element 4 of FIG. 7 to the sensing cells of the IGBT (breakdown voltage class: 600 V; rated current: 100 A) having the structure of FIG. 1, and the power supply voltage $V_{CC}$ was set at 400 V. As is seen from the waveform diagram, the collector current $I_C$ is reduced in several microseconds to a limited current value of 250 A less than the short-circuit withstanding capacity.

Figure 2:
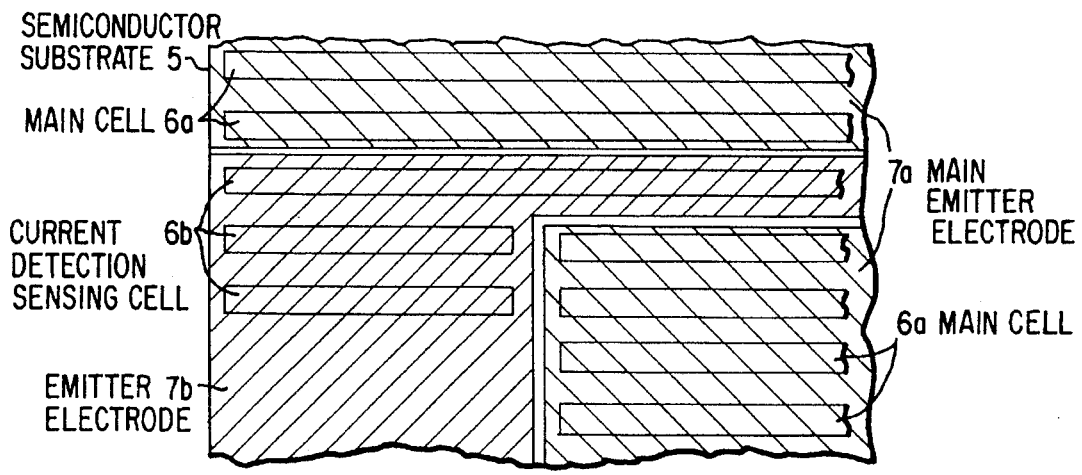
FIG. 2 is an enlarged view for showing chips of a current detecting portion of another embodiment of the invention.

FIG. 2 is an enlarged view of a chip showing a modified form of the current detecting sensing cells 6b of the embodiment shown in FIG. 1. In this embodiment, a part of the current detection sensing cells 6b is extended so that the three sides are surrounded by the active regions of the main cells 6a. By arranging the part of the sensing cells 6b in the above manner, the similarity of the carrier distribution between the areas of the sensing cells 6b and the main cells 6a is further enhanced to further improve the current detection accuracy, which enables a more reliable overcurrent protecting operation.

Figure 6:
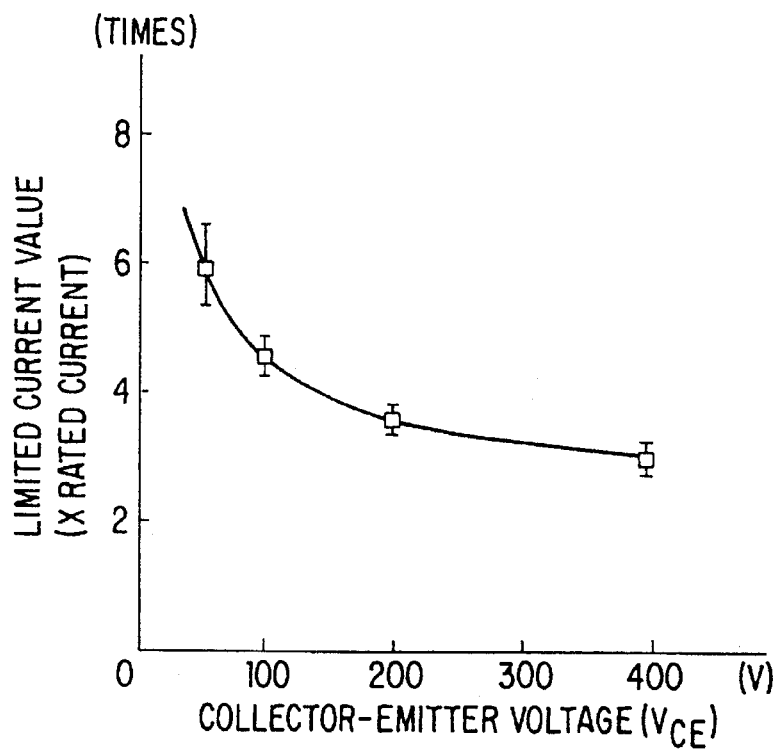
FIG. 6 is a characteristic diagram showing a relationship between the collector-emitter voltage and the limited current value before an improvement is made.

In order to evaluate the overcurrent protecting function of the above system, the present inventors examined the voltage dependency of the limited current value at the time of a short-circuit by using the test samples of the IGBTs of FIGS. 1 and 2. As a result, it has been found that as shown in FIG. 6, the limited current value (indicated by the multiplication number of the rated current $I_C$) tends to vary inversely relative to the collector-emitter voltage $V_{CE}$. For example, a short-circuit test was conducted with test samples of an IGBT having 70 micro meter of cell pitch P between the cells formed on the semiconductor substrate (see FIG. 1(b)) under various power supply voltage. The test has confirmed that the limited current value in a range of low collector-emitter voltage $V_{CE}$ of 100 V or less is more than two times larger than that at 400 V of the collector-emitter voltage $V_{CE}$, and that the variation of the limited current value is more remarkable in the low-voltage range.

It is thought that the above collector-emitter voltage dependency and the variation of the limited current value are caused by a variation of the potential distribution in the IGBT elements which depends on the magnitude of the applied voltage (power supply voltage) and varies the current flowing through the emitters of the sensing cells. A computer simulation analysis performed by the inventors with the applied voltage set at 100 V and 400 V showed that the distortion and variation of equipotential surfaces of the internal potential are larger for 100 V of the applied voltage than for 400 V.

Since the collector-emitter voltage $V_{CE}$ of the IGBT in the inverter apparatus varies with the short-circuit mode at a load short-circuit, the above-described voltage dependency and variation of the limited current value are unfavorable for the overcurrent protecting operation.

According to the inventors' notice on the internal potential distribution of the semiconductor substrate, however, the voltage dependency and variation of the limited current value would be improved if the equipotential surfaces of the internal potential could be made flat irrespective of the application voltage. As one of the approaches, the inventors investigated how the potential distribution in the element varies with respect to the cell pitch of the IGBT. And it has been found that the distortion of the equipotential surfaces of the internal potential distribution is reduced or made flatter by decreasing the cell pitch between the cells formed on the semiconductor substrate in a striped manner and, as a result, the collector-emitter voltage dependency and variation of the limited current value in the overcurrent protecting operation can be improved and minimized.

Figure 4:
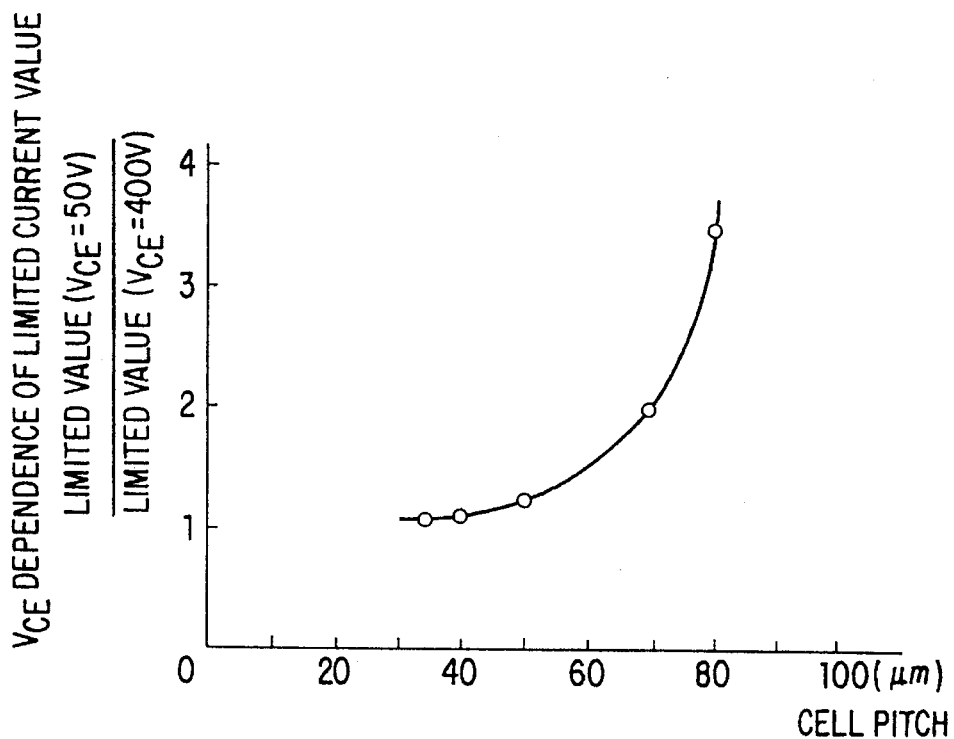
FIG. 4 is a characteristic diagram showing a relationship between the cell pitch and the collector-emitter voltage dependency of the limited current value.
Figure 5:
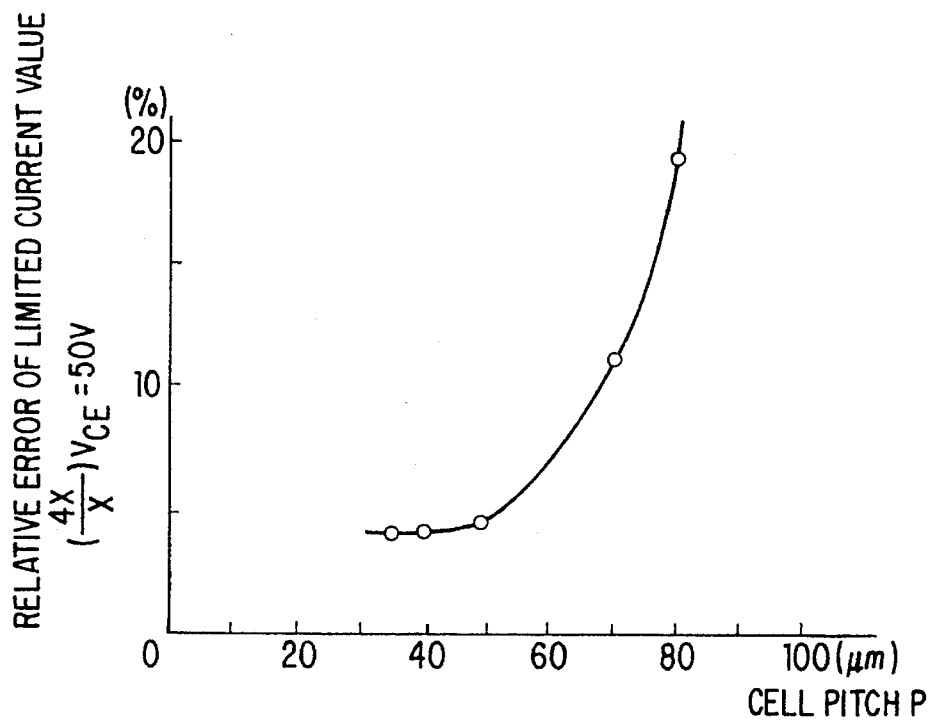
FIG. 5 is a characteristic diagram showing a relationship between the cell pitch and the relative error of the limited current value.

FIGS. 4 and 5 show a relationship between the cell pitch and the collector-emitter voltage ($V_{CE}$) dependency of the limited current value, and a relationship between the cell pitch and the relative error (variation) of the limited current value at $V_{CE}$=50 V, respectively. As is apparent from these figures, the voltage dependency and variation of the limited current value are improved as the cell pitch P decreases, and the improvements tend to almost converge for the cell pitch P less than 50 micro meter. Therefore, in designing and manufacturing IGBTs having the current detecting function for overcurrent protection, superior characteristics as to an overcurrent limiting function with little collector-emitter voltage dependency and variation can be obtained by setting the cell pitch P of the cells including the main cells 1 and the sense cells 2 of FIGS. 1 and 2 at a value less than 50 micro meter.

As described above, according to the invention, in an insulated-gate bipolar transistor including a number of cells integrally formed on a semiconductor substrate, parts of the cells are used as current detection sensing cells, and an emitter electrode to be connected to an overcurrent protection circuit is formed in an area of the sensing cells so as to be separated from an emitter electrode of the main cells. The sensing cells can accurately detect an overcurrent caused by a load short-circuit in an inverter apparatus. This makes possible to provide an insulated gate bipolar transistor having an overcurrent limiting function which enables a reliable overcurrent protecting operation by suppressing the limited current value smaller than the short-circuit withstanding capacity in combination with the overcurrent protection circuit.

The current detection accuracy is further improved, and the collector-emitter voltage dependency and variation of the limited current value can further be reduced by forming the current detection sensing cells so as to be surrounded by the active regions of the main cells on the same substrate and by setting the cell pitch less than 50 micro meter. Further, since the main cells and the sensing cells can be formed and integrated on a semiconductor substrate in the same semiconductor manufacturing process, the cost can be reduced from the conventional case, in which the main element and the auxiliary element are manufactured as separate elements.

What is claimed is:

1. An insulated-gate bipolar transistor comprising, one semiconductor substrate, at least one main cell integrally formed on said one semiconductor substrate and having at least one first emitter electrode, at least one current detection sensing cell integrally formed on said one semiconductor substrate and having at least one second emitter electrode separately from the first emitter electrode, said sensing cell being situated at a side of the main cell so that ratio between a current flowing through the main cell and a current flowing through the sensing cell is generally maintained at a substantially constant value, and an overcurrent protection circuit connected to the main cell and the sensing cell to protect the main cell.

2. An insulated-gate bipolar transistor according to claim 1, wherein said transistor includes a plurality of said main cells and a plurality of said sensing cells on said one substrate, at least one of the main cells and at least one of the sensing cells being arranged side by side.

3. An insulated-gate bipolar transistor according to claim 2, wherein said sensing cells are located at an edge area of the substrate.

4. An insulated-gate bipolar transistor according to claim 2, wherein at least a part of the sensing cells is situated between two of the main cells so that carrier distribution in the main cells approximates to that in the sensing cells.

5. An insulated-gate bipolar transistor according to claim 2, wherein said main cells and said sensing cells are arranged side by side, a pitch between the main and sensing cells being less than 50 micro meters.

\* \* \* \* \*